(12) United States Patent
Wang et al.

(10) Patent No.: US 8,030,759 B2
(45) Date of Patent: Oct. 4, 2011

(54) HEAT CONDUCTIVE PLATE STRUCTURE

(76) Inventors: Yu-Wei Wang, Taipei (TW);
Hung-Sheng Lin, Taichung (TW)

( * ) Notice: Subject to any disclaimer, the term of this patent is extended or adjusted under 35 U.S.C. 154(b) by 274 days.

(21) Appl. No.: 12/425,850

(22) Filed: Apr. 17, 2009

(65) Prior Publication Data
US 2010/0025030 A1    Feb. 4, 2010

(30) Foreign Application Priority Data
Aug. 1, 2008    (TW) ................................ 97129340 A

(51) Int. Cl.
*H01L 23/10* (2006.01)
(52) U.S. Cl. ......................................... 257/707; 438/125
(58) Field of Classification Search ................... 257/707
See application file for complete search history.

(56) References Cited

U.S. PATENT DOCUMENTS
2009/0091890 A1 *    4/2009    Ochi et al. .................... 361/704
* cited by examiner

*Primary Examiner* — Quoc Hoang
*Assistant Examiner* — Tony Tran
(74) *Attorney, Agent, or Firm* — Rosenberg, Klein & Lee

(57) ABSTRACT

A heat conductive plate structure includes a base metal plate having a seating portion; a coupling layer disposed above the base metal plate around the seating portion; an electric conduction layer disposed above the coupling layer around the seating portion to define a clearance therebetween; a coupling film disposed above the electric conduction layer and the seating portion to define an inner clearance in communication with the clearance of the electric conduction layer and an outer clearance surrounding the inner clearance; a non-weldable material for inserting into the inner clearance and the outer clearance in the coupling film; a heat conduction member disposed on a central portion of the coupling film; an electric conduction member disposed above the coupling film to surround the heat conduction member from an exterior thereof; and a high power element mounted above so as to be in direct contact with the heat conduction member and the electric conduction member simultaneously.

7 Claims, 9 Drawing Sheets

HEAT CONDUCTIVE PLATE STRUCTURE

This application claims the benefit of the Taiwan Patent Application Serial NO. 097129340, filed on Aug. 1, 2008, the subject matter of which is incorporated herein by reference.

BACKGROUND OF THE INVENTION

1. Field of the Invention

The present invention relates to a heat conductive plate structure, more particularly to a high heat conductive plate structure used within an LED assembly for carrying high power elements thereon.

2. Description of the Prior Art

According to the prior art technology, a heat conductive plate structure includes a base metal plate, upon which an insulated layer and a circuit layer are fabricated by thermo process technology for carrying high power elements. However, the thermal or heat conduction ability of high power elements is restricted by the insulated layer in the perpendicular direction with respect to the circuit layer. Thus, it is relatively difficult to increase the power of the electronic elements within the LED assembly.

SUMMARY OF THE INVENTION

The object of the present invention is to provide a new design for the heat conductive plate structure, in which the heat conduction effect of a base metal plate is increased and that the high power elements can be mounted directly on a portion of the base metal plate, thereby achieving high heat dissipating effect.

In order to better understanding of the present invention, some embodiment is illustrated in the following paragraphs accompanied by drawings.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTIONS OF THE PREFERRED EMBODIMENTS

Figure 1:
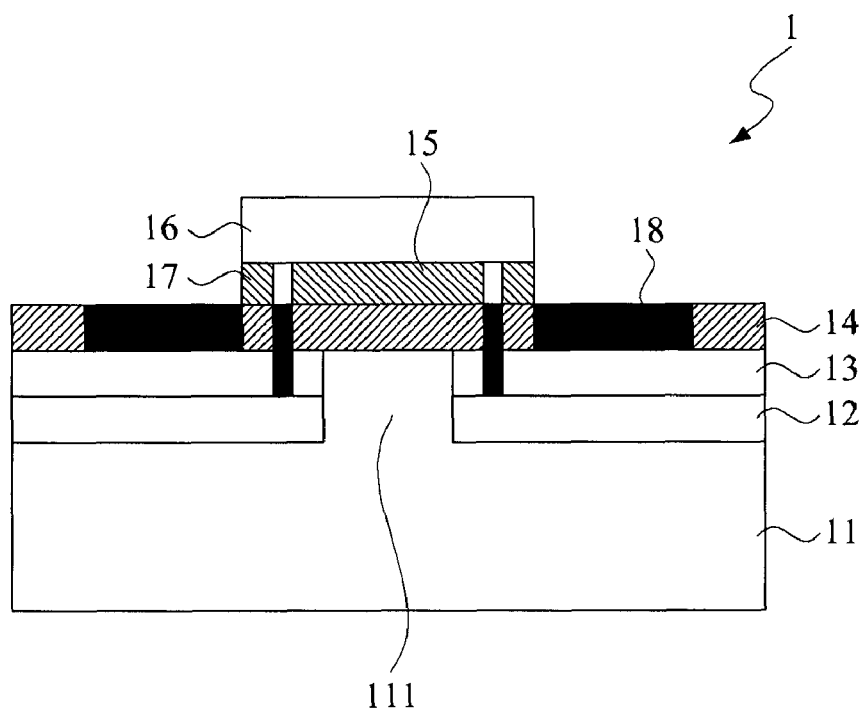
FIG. 1 is a cross sectional view of the first embodiment of a heat conduction plate structure of the present invention.
Figure 1A:
FIGS. 1A to 1H respectively illustrate the steps for forming the first embodiment of the heat conduction plate structure of the present invention.

FIG. 1 is a cross sectional view of the first embodiment of a heat conduction plate structure of the present invention. FIGS. 1A to 1H respectively illustrate the steps for forming the first embodiment of the heat conduction plate structure of the present invention.

As illustrated, the heat conductive plate structure 1 of the present invention includes a base metal plate 11, a coupling layer 12, an electric conduction layer 13, a coupling film 14, a non-weldable material 18, a heat conduction member 15, an electric conduction member 17 and a high power element 16.

The base metal plate 11 is made from silver or a metal alloy. The base metal plate 11 is in the form of block or elongated plate, and is cut in the shape shown in FIG. 1A.

Figure 1B:
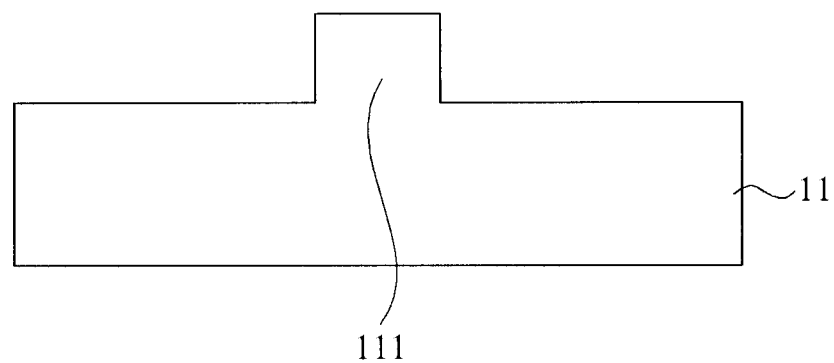
Figure 1C:
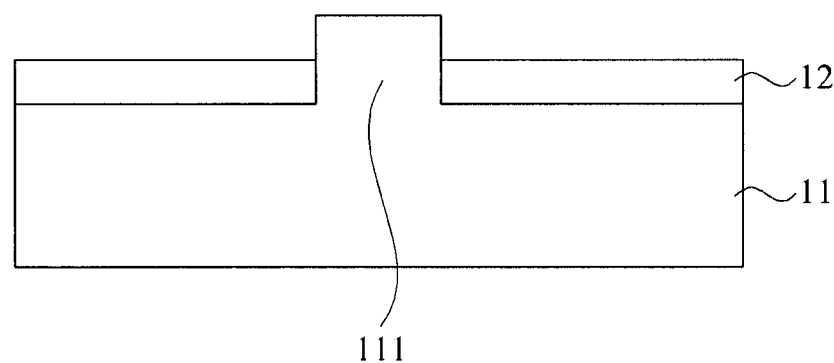
Figure 1D:
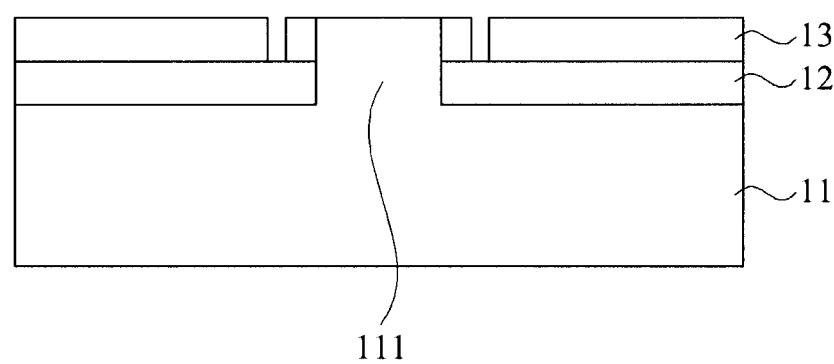
Figure 1E:
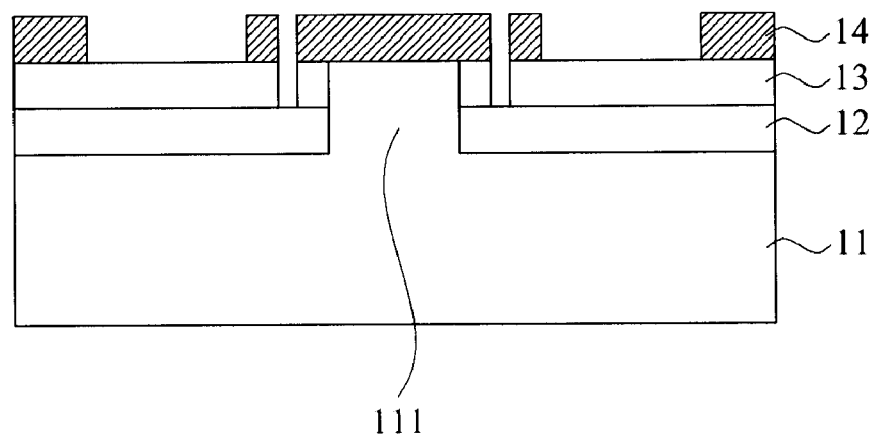

The base metal plate 11 has a seating portion 111 projecting upward from a central portion for thermal conduction. The seat portion 111 of the base metal plate 21 is formed by means of deposition, milling process, casting, welding or etching process, as shown in FIG. 1B.

The coupling layer 12 is disposed above the base metal plate 11 around the seating portion 111. The coupling layer 12 is fabricated from polymer material or composite of eutectic metal and is applied in a liquid or solid (pressurized) form for adhering to the base metal plate 11 (see FIG. 1C).

The electric conduction layer 13 is disposed above the coupling layer 12 around the seating portion 111 to define a clearance therebetween. The electric conduction layer 13 can be a silver foil, a printed circuit plate, a conductive body, a semi-conductor, piezoelectric material, thermoelectric material or a composite of the preceding materials for thermal conduction (see FIG. 1D).

The coupling film 14 is disposed above the electric conduction layer 13 and the seating portion 111, and defines an inner clearance in communication with the clearance of the electric conduction layer 13 and an outer clearance surrounding the inner clearance. The coupling film 14 is fabricated from depending on different requirements, such as a non-metal group and a metal group including tin, nickel and silver or a composite material from the non-metal group for holding the high power elements thereon (see FIG. 1E).

Figure 1F:
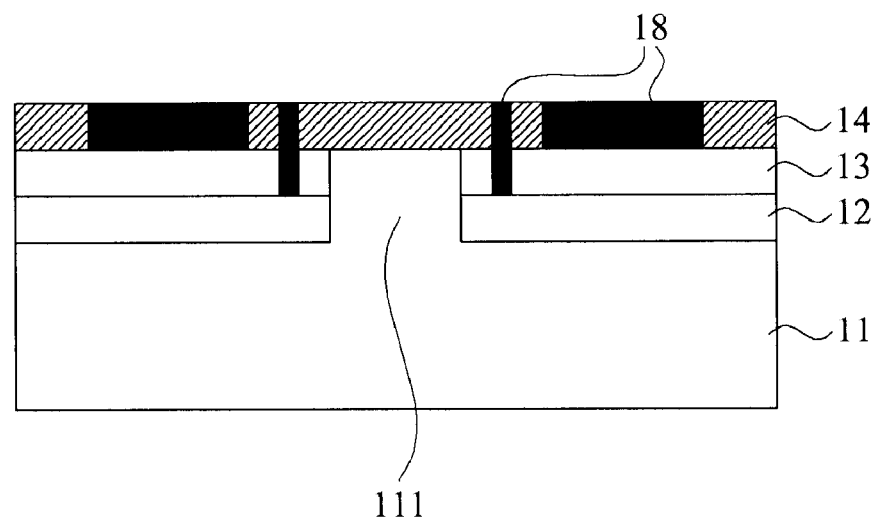

The non-weldable material 18 is inserted (filled) into the inner clearance and the outer clearance in the coupling film 14 to prevent welding action done onto the same (see FIG. 1F).

Figure 1G:
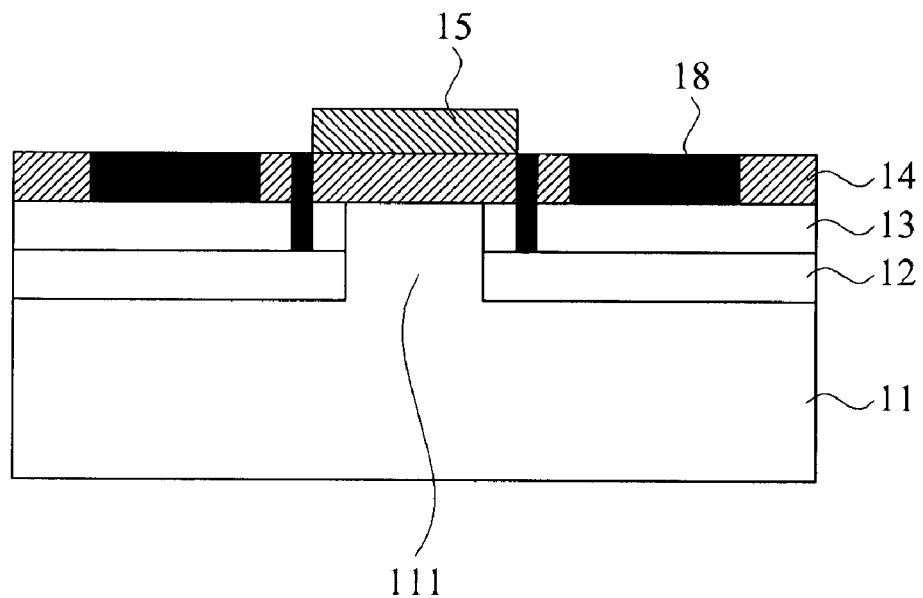
Figure 1H:
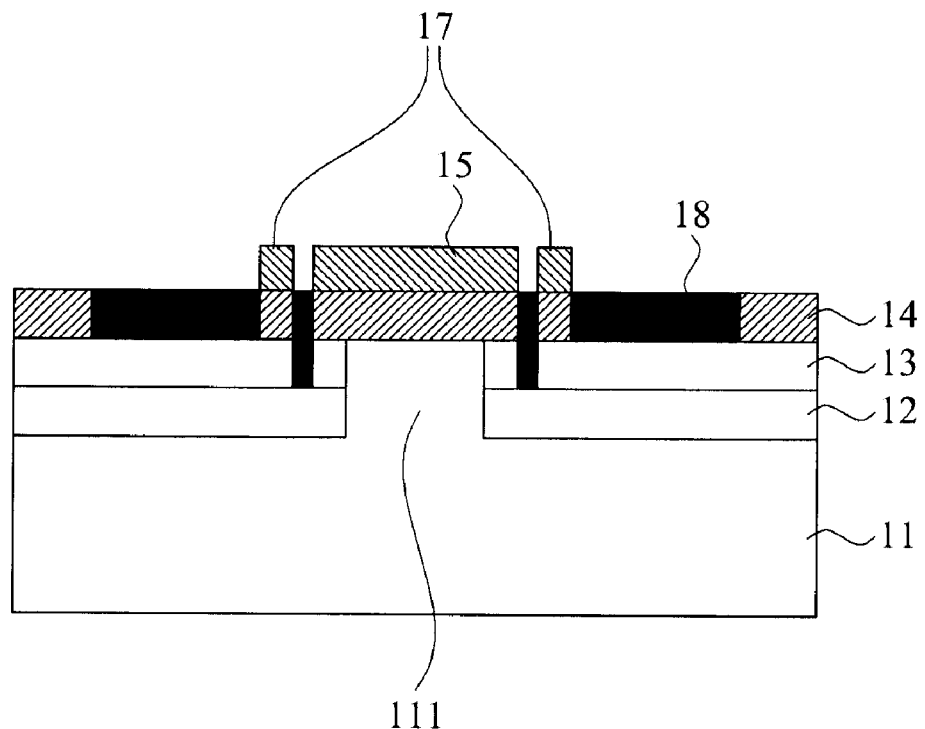

The heat conduction member 15 is disposed on a central portion of the coupling film 14 for holding other electronic elements and transferring the heat source (see FIG. 1G).

The electric conduction member 17 is disposed above the coupling film 14 to surround the heat conduction member 15 from an exterior thereof. In other words, a clearance is defined between the heat conduction member 15 and the electric conduction member 17. The electric conduction member 17 is used for coupling other electronic elements to the base metal plate and for transferring the power therebetween (see FIG. 1H).

The high power element 16 is disposed above so as to be in direct contact with the heat conduction member 15 and the electric conduction member 17 simultaneously, thereby completing installing of the high power element 16 on the heat conductive plate structure 1 of the present invention (see FIG. 1).

In this embodiment, the base metal plate 11 is a silver plate. The coupling layer 12 is applied in a solid-type glue or gel form. The electric conduction layer 13 is a silver foil.

Figure 2:
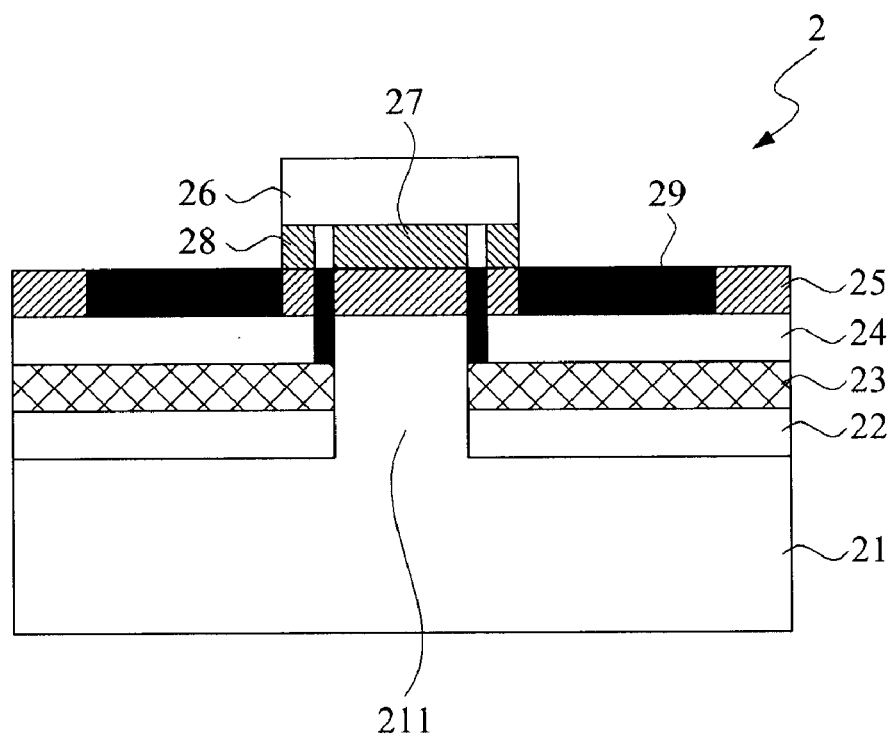
FIG. 2 is a cross sectional view of the second embodiment of the heat conduction plate structure of the present invention.
Figure 2A:
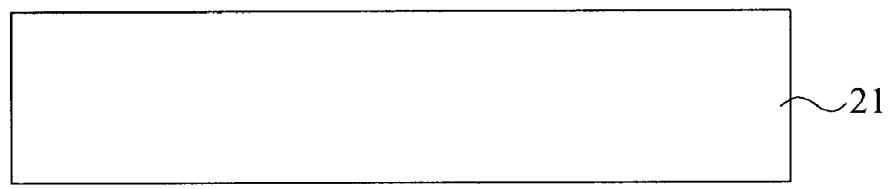
FIGS. 2A to 2I respectively illustrate the steps for forming the second embodiment of the heat conduction plate structure of the present invention.

FIG. 2 is a cross sectional view of the second embodiment of the heat conduction plate structure 2 of the present invention and includes a base metal plate 21, a coupling layer 22, an insulated layer 23, an electric conduction layer 24, a coupling film 25, a non-weldable material 29, a heat conduction member 27, an electric conduction member 28 and a high power element 26.

FIGS. 2A to 2I respectively illustrate the steps for forming the second embodiment of the heat conduction plate structure of the present invention.

The base metal plate 21 is a silver plate or a metal alloy. The base metal plate 21 is in the form of block or an elongated plate, and is cut in the shape shown in FIG. 2A.

The base metal plate 21 has a seating portion 211 projecting upward from a central portion for thermal conduction.

Figure 2B:
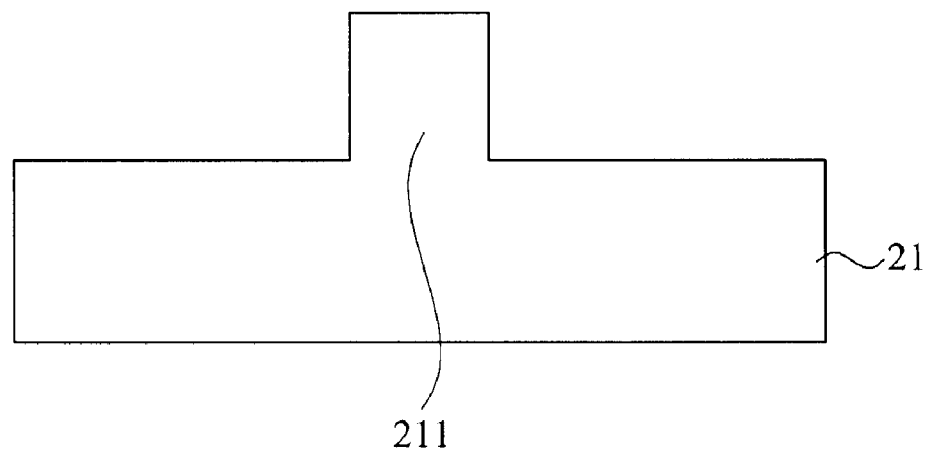
Figure 2C:
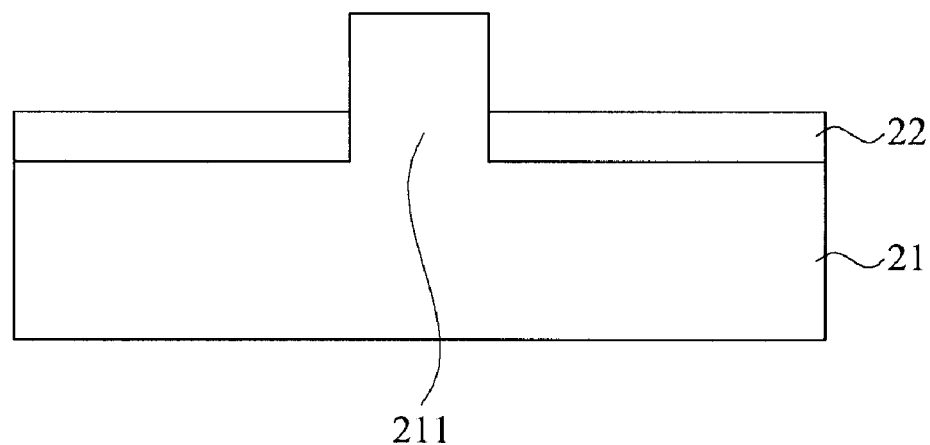
Figure 2D:
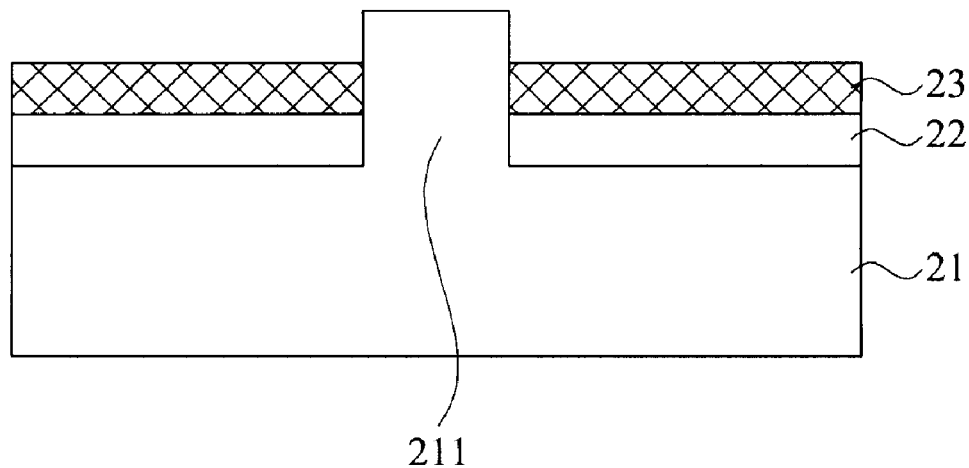
Figure 2E:
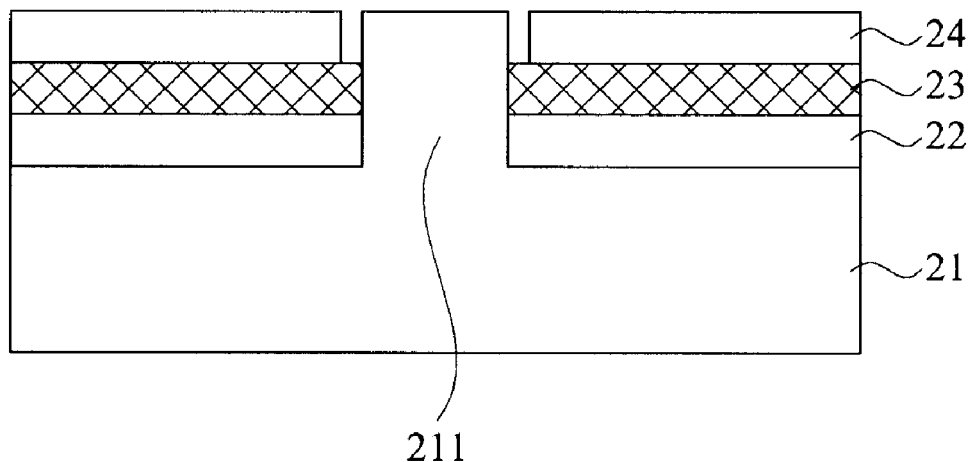
Figure 2F:
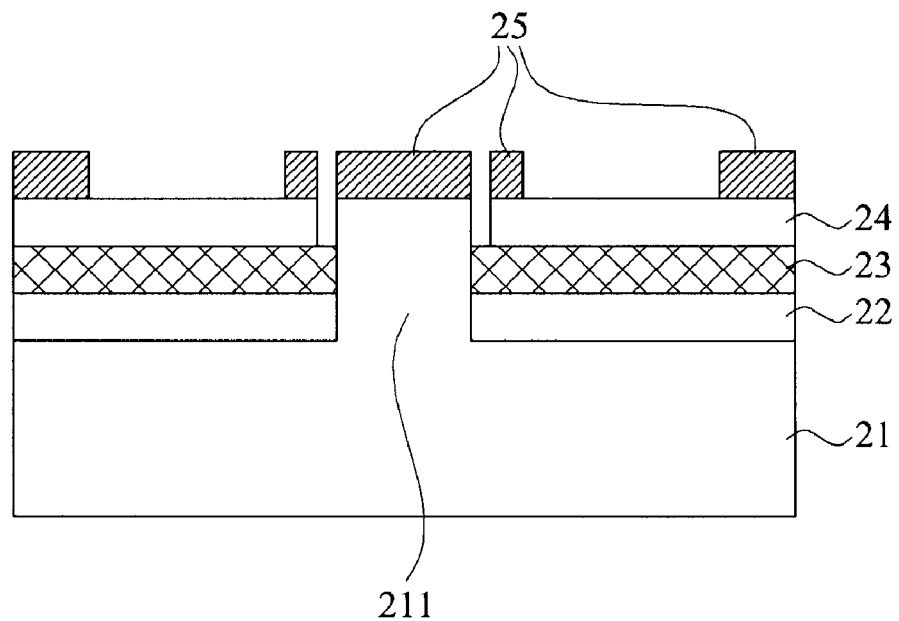

The seat portion 211 of the base metal plate 21 is fabricated by means of deposition, milling process, casting, welding or etching process, as shown in FIG. 2B.

The coupling layer 22 is disposed above the base metal plate 21 around the seating portion 211. The coupling layer 22 is fabricated from polymer material or composite of eutectic metal and is applied in a liquid or solid (pressurized) form for adhering to the base metal plate 21 (see FIG. 2C).

The insulated layer 23 is disposed above the coupling layer 22 around the seating portion 211. The insulated layer 23 is fabricated from polymer material, ceramic material, glass fiber or a composite of the preceding materials. The insulated layer 23 is used to prevent transmission of the electricity therethrough. The insulated layer 23 and the coupling layer 22 are used together or singly depending on the requirement of the application (see FIG. 2D).

The electric conduction layer 24 is disposed above the insulated layer 23 around the seating portion 211. The electric conduction layer 24 can be a silver foil, a printed circuit plate, a conductive body, a semi-conductor, piezoelectric material, thermoelectric material or a composite of the preceding materials for thermal conduction. The electric conduction layer 24 further defines a clearance around the seating portion 211 (see FIG. 2E).

The coupling film 25 is disposed above the electric conduction layer 24 around the seating portion 211, and defines an inner clearance in communication with the clearance of the electric conduction layer 24 and an outer clearance surrounding the inner clearance. The coupling film 25 is fabricated from depending on different requirements, such as a non-metal group and a metal group including tin, nickel and silver or a composite material from the non-metal group for holding the high power elements thereon (see FIG. 2F).

Figure 2G:
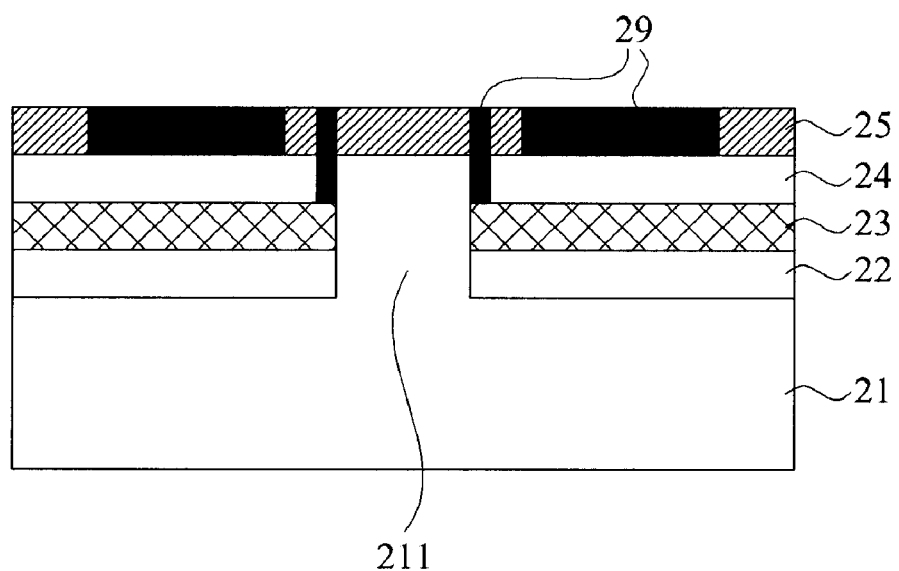

The non-weldable material 29 is inserted (filled) into the inner clearance and the outer clearance in the coupling film 25 in such a manner that the non-weldable material in the inner clearance is sandwiched between the electric conduction layer 24 and the seating portion 211 to prevent welding action done onto the same (see FIG. 2G).

Figure 2H:
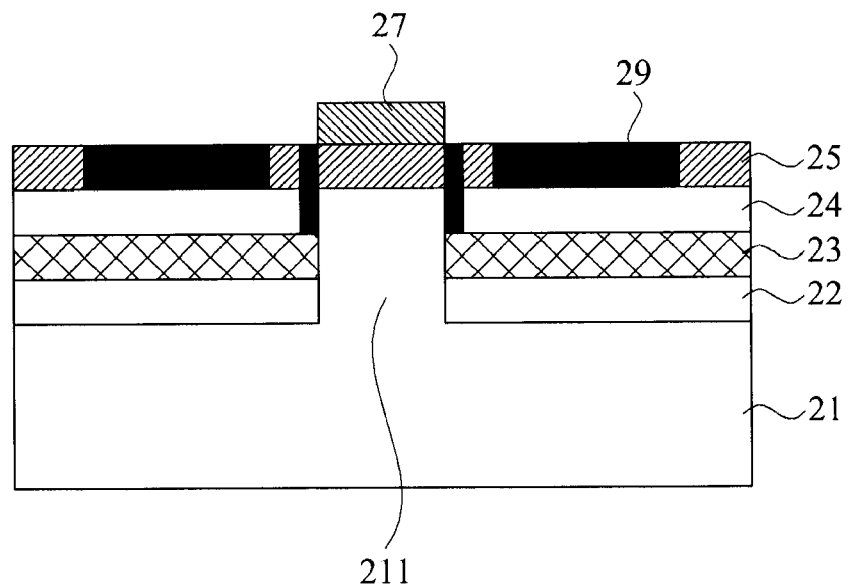
Figure 2I:
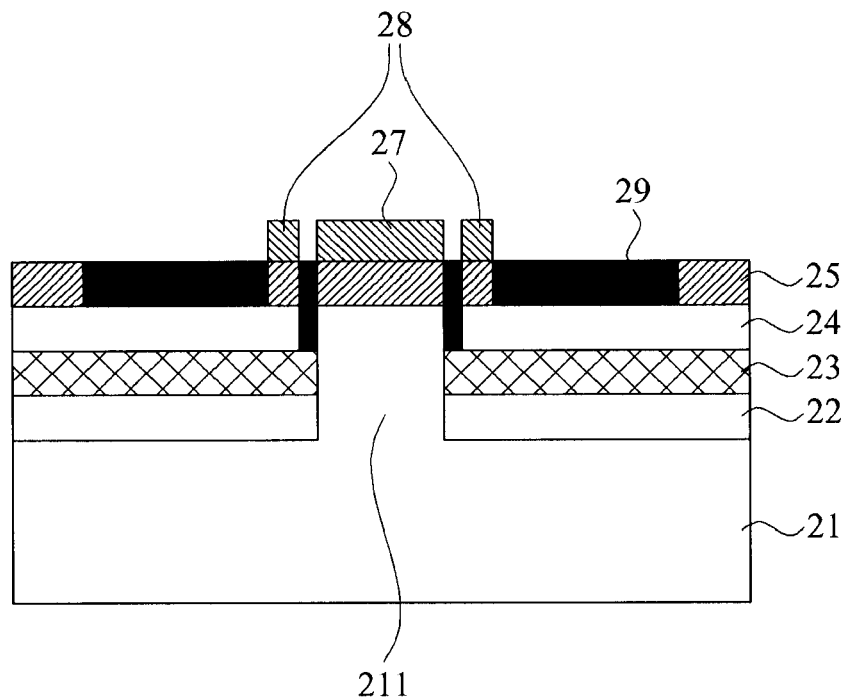

The heat conduction member 27 is disposed on a central portion of the coupling film 25 for holding other electronic elements and transferring the heat source (see FIG. 2H).

The electric conduction member 28 is disposed above the coupling film 25 to surround the heat conduction member 27 from an exterior thereof. In other words, a clearance is defined between the heat conduction member 27 and the electric conduction member 28. The electric conduction member 28 is used for coupling other electronic elements to the base metal plate 21 and for transferring the power therebetween (see FIG. 2I).

The high power element 26 is disposed above so as to be in direct contact with the heat conduction member 27 and the electric conduction member 28 simultaneously, thereby completing installing of the high power element 26 on the heat conductive plate structure 2 of the present invention (see FIG. 2).

In this embodiment, the base metal plate 21 is a silver plate. The coupling layer 22 is applied in a solid-type glue or gel form. The insulated layer 23 is fabricated from glass fiber. The electric conduction layer 24 is a printed circuit plate for forming the second embodiment of the present invention. The coupling layer 22 can also be applied in a liquid type glue. The insulated layer 23 can be fabricated from ceramic material and the electric conduction layer 24 can be fabricated from thermoelectric material, thereby completing forming of the heat conductive plate structure 2 of the present invention.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A heat conductive plate structure comprising:
   a base metal plate having a seating portion projecting upward from a central portion for thermal conduction;
   a coupling layer disposed above said base metal plate around said seating portion;
   an electric conduction layer disposed above said coupling layer around said seating portion to define a clearance therebetween;
   a coupling film disposed above said electric conduction layer and said seating portion, and defining an inner clearance in communication with said clearance of said electric conduction layer and an outer clearance surrounding said inner clearance;
   a non-weldable material for inserting into said inner clearance and said outer clearance in said coupling film, said non-weldable material within said outer clearance is in contact with said electric conduction layer and said non-weldable material within said inner clearance surrounds said seating portion of said base metal plate from an exterior thereof;
   a heat conduction member disposed on a central portion of said coupling film;
   an electric conduction member disposed above said coupling film to surround said heat conduction member from an exterior thereof; and
   a high power element mounted above so as to be in direct contact with said heat conduction member and said electric conduction member simultaneously.

2. The heat conductive plate structure according to claim 1, further comprising at least one insulated layer sandwiched between said coupling layer and said electric conduction layer.

3. The heat conductive plate structure according to claim 1, wherein said coupling layer is fabricated from polymer material or composite of eutectic metal and is applied in a liquid or pressurized form.

4. The heat conductive plate structure according to claim 1, wherein said heat conduction member and said electric conduction member cooperatively define a clearance therebetween.

5. The heat conductive plate structure according to claim 1, wherein said coupling film is fabricated from a non-metal group and a metal group including tin, nickel and silver or a composite material from said non-metal group.

6. The heat conductive plate structure according to claim 2, wherein said insulated layer is fabricated from polymer material, ceramic material, glass fiber or a composite of the preceding materials.

7. The heat conductive plate structure according to claim 2, wherein said electric conduction layer can be a conductive body, a semi-conductor, piezoelectric material, thermoelectric material or a composite of the preceding materials.

* * * * *